United States Patent [19]
Tsai

[11] Patent Number: 6,140,156
[45] Date of Patent: Oct. 31, 2000

[54] FABRICATION METHOD OF ISOLATION STRUCTURE PHOTODIODE

[75] Inventor: Meng-Jin Tsai, Kaohsiung, Taiwan

[73] Assignee: United Microelectronics Corp., Taiwan

[21] Appl. No.: 09/352,478

[22] Filed: Jul. 13, 1999

[51] Int. Cl.[7] ................................................ H01L 21/339
[52] U.S. Cl. ........................ 438/148; 438/221; 438/296; 438/427
[58] Field of Search ................................ 438/24, 29, 148, 438/57, 221, 296, 353, 427, 420; 257/453, 457, 471, 483, 484, 481, 506, 510

[56] References Cited

U.S. PATENT DOCUMENTS

| | | | |
|---|---|---|---|
| 4,472,240 | 9/1984 | Kameyama | 438/427 |
| 4,636,281 | 1/1987 | Buiguez et al. | 438/426 |
| 4,679,304 | 7/1987 | Bois | 438/426 |
| 5,298,450 | 3/1994 | Verret | 438/207 |
| 5,874,317 | 2/1999 | Stolmeijer | 438/296 |
| 5,895,253 | 4/1999 | Akram | 438/424 |

FOREIGN PATENT DOCUMENTS

| | | |
|---|---|---|
| 0773582A2 | 5/1997 | European Pat. Off. . |
| 0853338A1 | 7/1998 | European Pat. Off. . |

*Primary Examiner*—Donald L. Monin, Jr.
*Assistant Examiner*—Hoai Pham
*Attorney, Agent, or Firm*—Martine Penilla & Kim, LLP

[57] ABSTRACT

A method for fabricating a photodiode is described in which a pad oxide layer and a silicon nitride layer are sequentially formed on a provided substrate. The silicon nitride layer, and the pad oxide layer and the substrate are sequentially patterned to form an opening in the substrate. A spacer is formed on the sidewall of the opening. With the spacer and the silicon nitride layer serving as a mask, the substrate is etched forming a trench in the substrate. An oxide plug is then formed filling the trench and the opening using the conventional shallow trench fabrication method. A P-well region and an N-well region are formed respectively on two sides of the trench. An N+ type region and a P+ type region are formed respectively on two sides of the opening; wherein the N+ type region is located above the P-well region and the P+ type region is located above the N-well region

4 Claims, 12 Drawing Sheets

FABRICATION METHOD OF ISOLATION STRUCTURE PHOTODIODE

BACKGROUND OF THE INVENTION

1. Field of the Invention

This invention relates to a fabrication method of a semiconductor. More particularly, this invention relates to a fabrication method of a photodiode.

2. Description of the Related Art

There are broad applications for a photodiode, such as photo image sensors, digital cameras, devices for video conference, and barcode readers.

For a photodiode, the photodiode dark current is the most serious factor adversely affecting the sensitivity and the performance of a photodiode. A photodiode fabricated by the conventional shallow trench isolation technique often results in high electrical field at the junction edge. This high electrical field at the junction edge will create a leakage path that generates a relatively high dark current. The occurrence of a high dark current is especially significant in a semiconductor device fabricated through the sub-micron technology, for example, 0.25 μm and below.

FIGS. 1A to 1E are schematic, cross-sectional views showing the manufacturing steps for a photodiode.

Figure 1A:
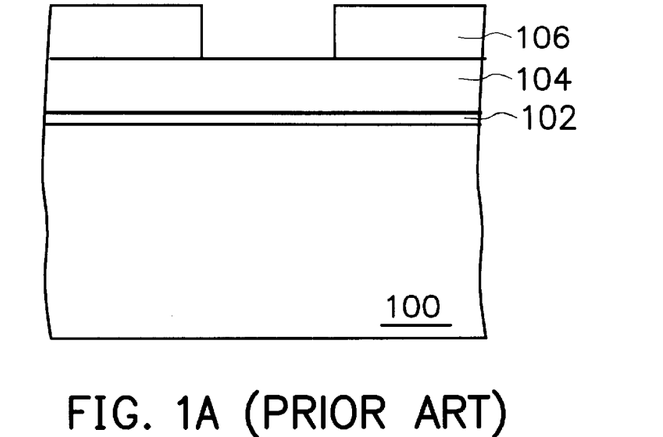
FIGS. 1A to 1E, are schematic, cross-sectional views showing the manufacturing steps for a photodiode according to the prior art.

Referring to FIG. 1A, a pad oxide layer 102, a silicon nitride layer 104 and a photoresist pattern 106 are sequentially formed on the substrate 100.

Figure 1B:
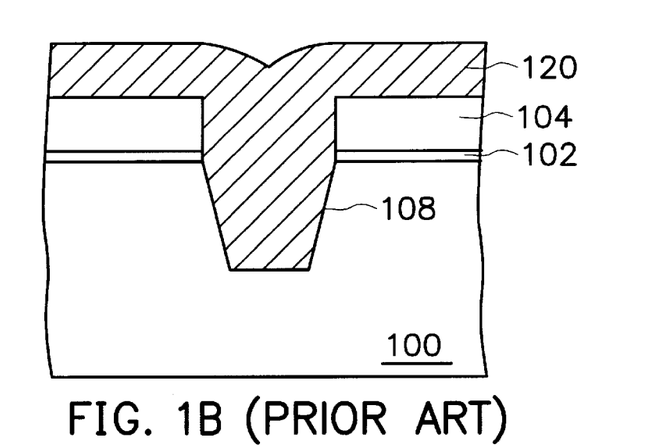

Referring to FIG. 1B, the substrate 100 is etched to form a trench 108 in the substrate 100, with the photoresist 106 pattern serving as a mask. An oxide layer 120 is further formed in the trench 108 filling the opening 108 and covering the silicon nitride layer 104.

Figure 1C:
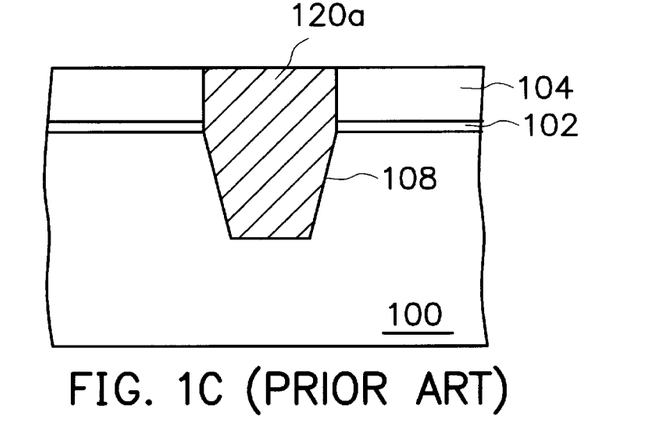

As shown in FIG. 1C, the oxide layer 120a above the silicon nitride layer 104 is removed.

Figure 1D:
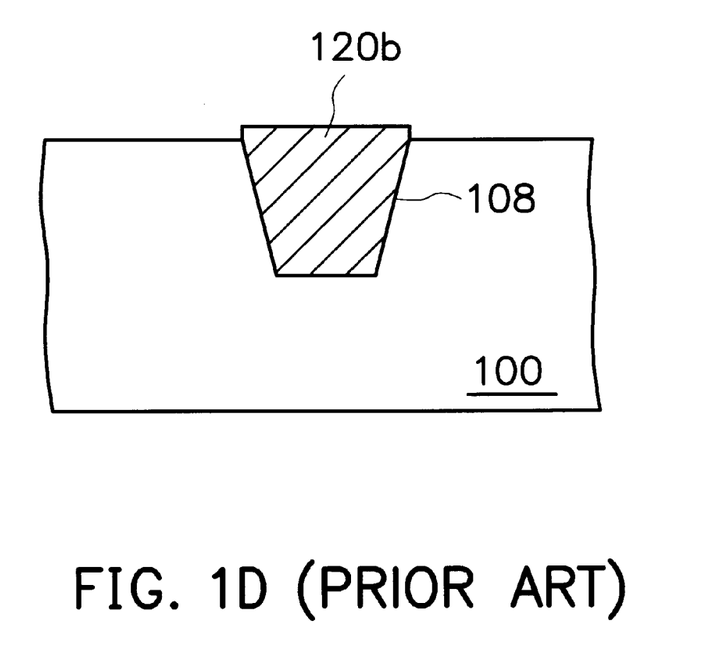

Referring to FIG. 1D, the silicon nitride layer 104 and the oxide pad 102 are removed. A portion of the oxide layer 120a (in FIG. 1C) is also removed, leaving the oxide layer 120b.

Figure 1E:
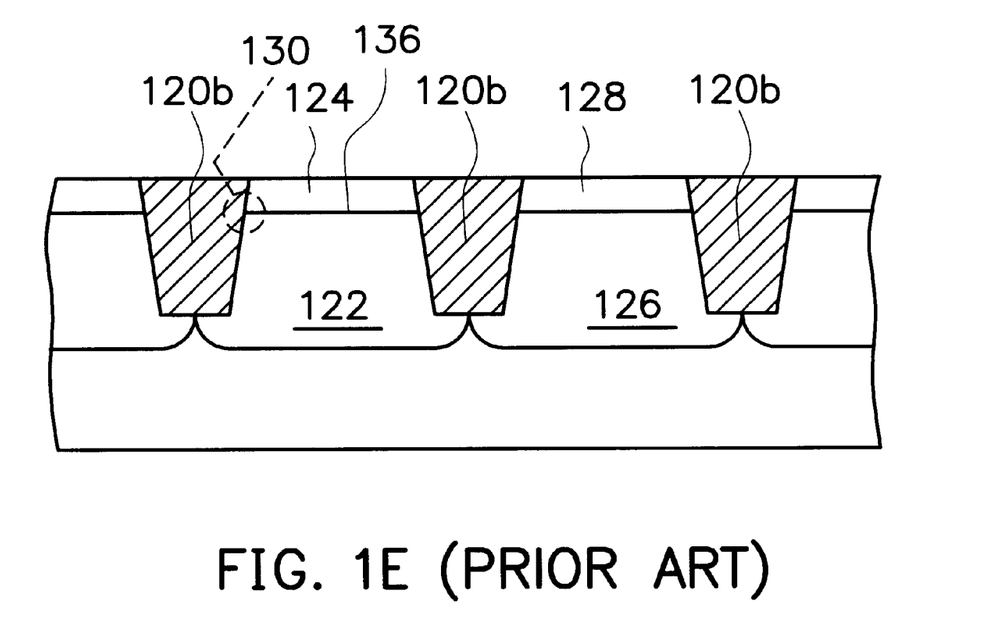

As shown in FIG. 1E, ion implantation is conducted on a P-well region 126, an N-well region 122, a P+ type region 124 and an N+ type region 128. The desired concentrations and depths of the implanted ion for these regions can be achieved by using the different masks and the appropriate operating conditions. FIG. 1E further includes the surroundings of the shallow trench isolation structure, which indicates the presence of more than one oxide plug 120, and the relative positions of the P well region 126, the N well region 124, the P+ type region and the N+ type region. FIG. 1E also shows a P-N junction 136. The edge 130 of the junction 136 is likely the place to have a leakage path that results in a high photodiode dark current.

SUMMARY OF THE INVENTION

The current invention provides a fabrication method of a photodiode in which pad oxide layers and silicon nitride layers are sequentially formed on the substrate. The silicon nitride layers, the pad oxide layers and the substrate are sequentially patterned to form an opening in the substrate, followed by forming a spacer on the sidewall of the opening. The substrate is etched, with the spacer and the silicon nitride layers serving as a mask, to form a trench in the substrate. An oxide plug is formed by the conventional shallow trench fabrication method, filling the trench and the opening. A P well region and an N well region are formed respectively on the two sides of the trench. An N+ region are formed on the two sides of the opening, in which the N+ type region is located on the P well region and the P+ type region is located on the N well region.

The current invention provides a fabrication method of a photodiode in which a pad oxide layer and a silicon nitride layer are sequentially formed on the substrate. The silicon nitride layer, the pad oxide layer and the substrate are then sequentially patterned to form an opening in the substrate, followed by forming a photoresist pattern in the opening. The substrate is etched, with the photoresist pattern serving as a mask, to form a trench in the substrate. An oxide plug is formed by the conventional shallow trench fabrication method to fill the trench and the opening. A P well region and an N well region are formed on the two sides of the trench respectively. A N+ type region and a P+ type region are formed on the two sides of the opening, in which the N+ type region is located on the P well region and the P+ type region is located on the N well region.

The current invention provides a fabrication method of a photodiode in which a pad oxide layer and a patterned silicon oxide layer are sequentially formed on a provided substrate. A thermal treatment is conducted to develop a field oxide layer. A spacer is then formed on the sidewall of the patterned silicon oxide layer. With the spacer and the patterned silicon oxide layer serving as a mask, the field oxide layer and the substrate are etched to form a trench in the substrate. An oxide layer is deposited filling the trench, and covering the spacer and the patterned silicon oxide layer. A P well region and an N well region are formed on both sides of the oxide plug. An N+ type region is formed on the P well region and a P+ type region is formed on the N well region, wherein the N+ type and P+ type regions are higher than the trench.

The current invention provides a fabrication method of a photodiode in which a pad oxide layer and a patterned silicon oxide layer are sequentially formed on the substrate. A thermal treatment is conducted to develop a field oxide layer. A photoresist pattern is formed on the field oxide layer and the patterned silicon nitride layer. With the photoresist layer and the spacer serving as a mask, the field oxide layer and the substrate are etched to form a trench in the substrate, wherein the trench is located underneath the field oxide layer and is narrower than the field oxide layer. The photoresist pattern is then removed. An oxide layer is deposited filling the trench, and covering the field oxide layer and the patterned silicon nitride layer. An oxide plug is formed according to the conventional shallow trench fabrication method. A P well region and an N well region are formed respectively on the two sides of the oxide plug. An N+ type region is formed on the P well region and a P+ type region is formed on the N well region, wherein the N+ type and P+ type regions are higher than the trench.

This invention provides, at least, the following advantages. With the new photodiode structure, the breakdown voltage increases and the P-N junction leakage decreases. A decrease in the junction leakage leads to a reduction of the photodiode dark current. The sensitivity of a light sensor device is also increased when the new photodiode is applied.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT (First Embodiment)

Figure 2:
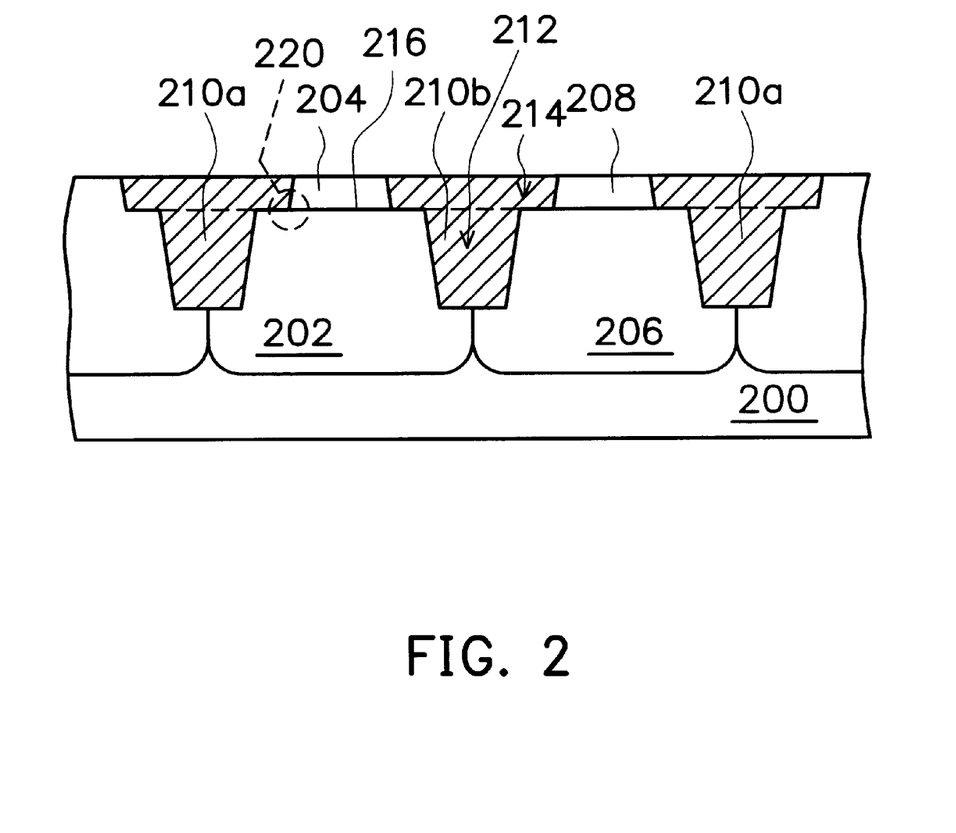
FIG. 2 is a schematic cross-sectional view of a photodiode according to the present invention.

FIG. 2 is a cross-sectional view of a photodiode according to the present invention.

Referring to FIG. 2, the photodiode comprises a junction structure 216, which is formed by two regions of opposite conductive types. These regions include doped silicon layers. The first conductive type region is referred as an N type region 202 when an N type dopant is implanted therein, while the first conductive type region is referred as a P type region 206 when a P type dopant is implanted therein. Using the N type region 202 for the first conductive type region as an example, the first conductive type region 202 has a flat profile at the junction 216. Contrarily, the second conductive type region 204, located on top of the first conductive type region 202 and having an opposite charge to the first conductive type region 202, comprises a corner at the edge 220 of the junction 216, indicted by a circle in the Figure. In addition, the second conductive type region 204 is adjacent to an insulation layer 210a, and this insulation layer 210a is also adjacent to the first conductive type region 202.

In further details, the photodiode structure according to the current invention comprises at least three components. These three components include a P type region 204, an N type region 202, and an insulation layer 210a. These components are formed on a substrate, for example, a silicon substrate 200. Between the P type region 204 and the N type region 202 is a P-N junction 216. The two regions 202, 204 are formed with one region on top of the other, and the order is dependent on the requirement of the process or the structure. In the current embodiment, the bottom region 202 is referred as the first conductive type region, and the top region 204 is referred as the second conductive type region. The insulation layers 210a and 210b, formed on both sides of the second conductive type region 204, also cover the first conductive type region 202. The right and the left insulation layers are designated as 210a and 210b respectively.

The cross sectional area of the first conductive type region 202 is larger than that of the second conductive type region 204; and hence the second conductive type 204 is within the domain of the first conductive type region 202. As a result, only the second conductive type region 204 comprises a corner at the edge 220 of the P-N junction 216. On the other hand, the first conductive type region 202 has a flat profile at edge 200 of the P-N junction 216. A flat junction structure implies a low junction curvature and a high junction curvature radius, and hence an increase in the junction breakdown voltage and a decrease in the junction leakage current. A reduction in the leakage current in turn decreases the photodiode dark current. An application of the photo-diode according to this invention to a light sensor device increases the sensitivity of the device.

A photodiode according to the current invention can be achieved through an optimizing of the process condition. This type of photodiode is especially suitable for the submicron technology for a semiconductor device, for example 0.25 $\mu$m and below.

The present invention also applicable to the fabrication of a shallow trench isolation structure 212. As shown in FIG. 2, the shallow trench isolation structure 212 includes an oxide plug 210b. The oxide plug fills an opening, formed by the first conductive type regions 202, 208 and the second conductive type regions 204, 206. In the current embodiment, there are two groups of the conductive type area pair. In the first group, the P type region 204 is located on top of the N type region 202; while in the second group, the N type region 208 is located on top of the P type region 206. The bottom regions 202, 206 are adjacent to each other and both are well regions. The upper regions 204 and 208 and the upper part of the bottom regions 202 and 206 are not connected together; and these isolated regions form the necessary shallow trench.

The present embodiment can also be presented as the following. A shallow trench isolation structure includes an N well region 202 and a P well region 206. These N well 202 and the P well 206 regions are partially adjacent to each other to form a shallow trench 212 between the two regions. The shallow trench isolation structure further includes a P+ type region 204 and an N+ type region 208, and each is located on the N well region 202 and the P well region 206 respectively. The P+ type region 204 and the N+ type region 208 are not adjacent to each other, and an opening 214 is formed between the N+ type region 204 and P+ type region 208. The cross sectional area of the opening 214 is larger than that of the trench, thereby completely exposing the trench 212 underneath. This opening 214 and the trench 212 together form a shallow trench, which is completely filled with a T-shaped oxide plug 210b.

Figure 3A:
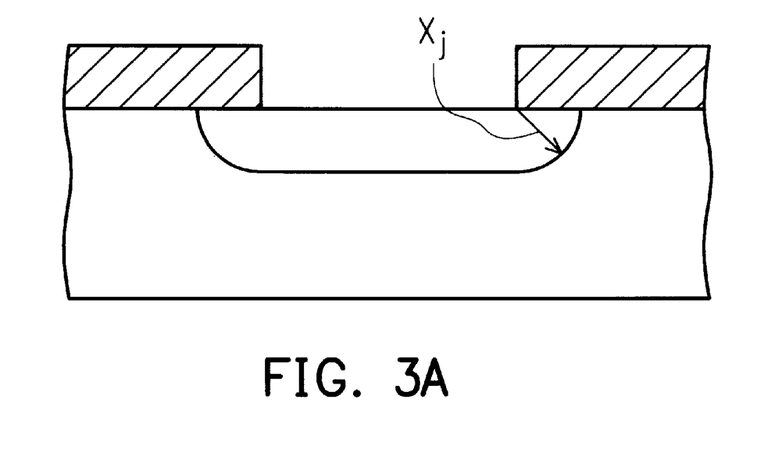
FIG. 3A is a schematic cross-sectional view of a P-N junction structure formed by a planar diffusion process.

The curvature effect is an important factor to consider for the breakdown voltage. FIG. 3A is a schematic diagram of a P-N junction structure formed by a planar diffusion process. As shown in FIG. 3A, a window is formed in the insulation layer, indicated by the diagonal lines regions, and the substrate underneath the insulation layer is, for example, an N-type region. A P-type region is formed between the insulation layer and the N type region, by diffusion of dopants through the widow downward and sideways. $X_j$ in the P-type region is the junction radius. In general, an increase in the junction radius decreases the junction curvature.

Figure 3B:
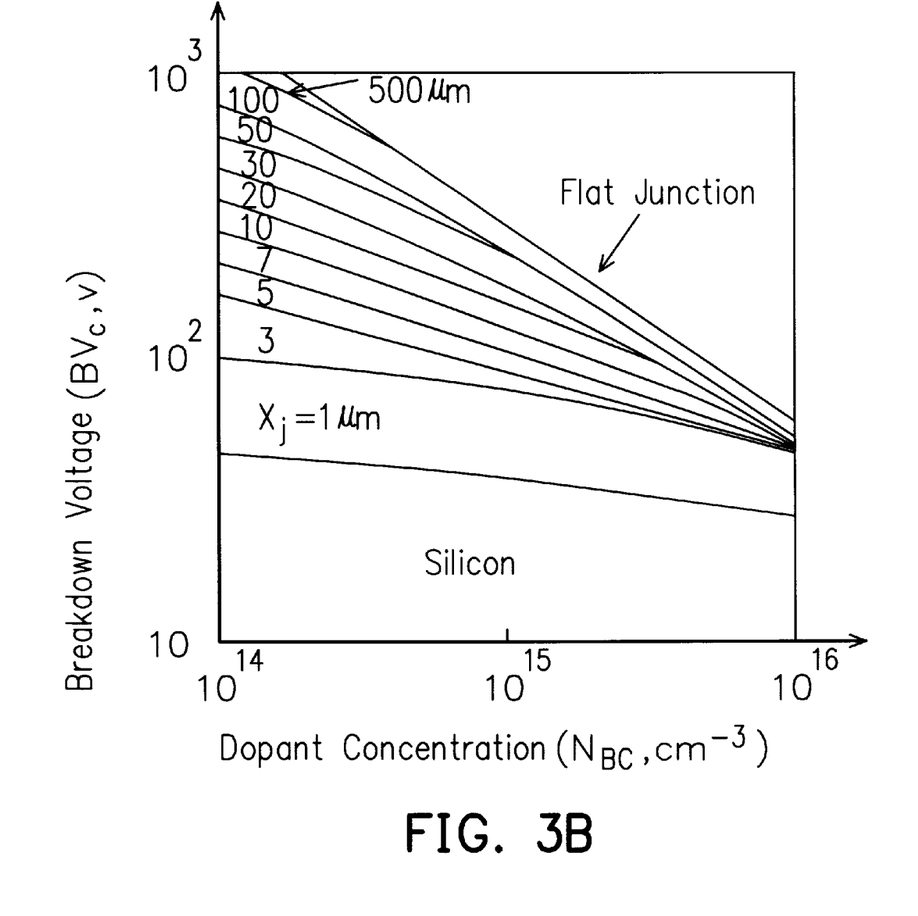
FIG. 3B is a graph showing the effect of the dopant concentrations on the breakdown voltage at the various junction curvatures of the conductive type region structure according to FIG. 3A.

FIG. 3B is in accordance to FIG. 3A, which illustrates the effect of dopant concentrations on the junction breakdown voltage at the various junction curvatures of a conductive type region. The upper curves are resulted from a conductive region with a higher junction radius and the bottom curves are resulted from a conductive region with a lower junction radius. The x-axis 310 represents the dopant concentrations and the y-axis 320 represents the breakdown voltage. The top curve represents the effect of the dopant concentrations on the breakdown voltage at a flat junction ($X_j \to \infty$). As indicated in the FIG. 3, at the same dopant concentration 310, a smaller junction curvature increases the breakdown voltage and therefore decreases the junction leakage.

The fabrication of a shallow trench isolation structure is disclosed in the following second to fifth embodiments.

(Second Embodiment)

FIGS. 4A to 4E are schematic cross-sectional views of a shallow trench isolation structure showing the manufacturing process of a shallow trench isolation structure according to the current invention.

Figure 4A:
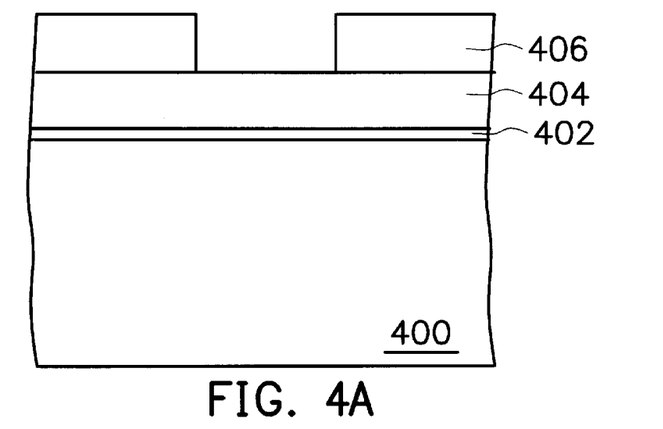
FIGS. 4A to 4E are schematic, cross-sectional views showing the manufacturing steps for a photodiode.

Referring to FIG. 4A, a pad oxide layer 402, a silicon nitride layer 404 and a photo resist pattern 406 are sequentially formed on a substrate 400.

Figure 4B:
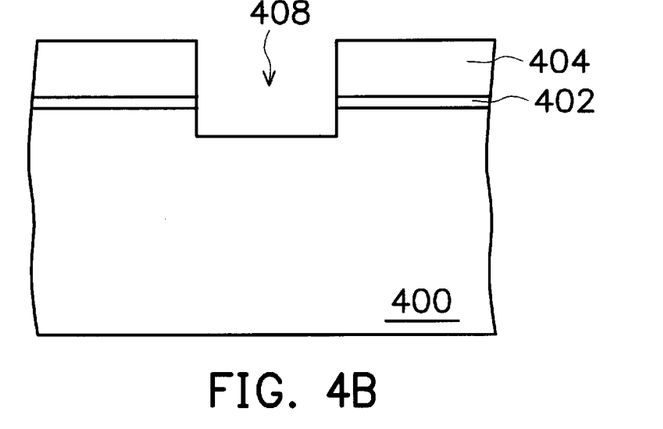

Referring to FIG. 4B, with the photo resist pattern 406 serving as a mask, the substrate 400 is etched to form an opening 408 in the substrate 400.

Figure 4C:
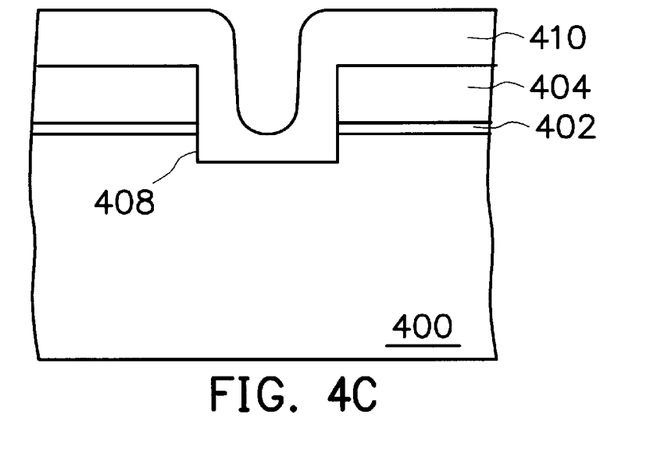

As shown in FIG. 4C, a thin oxide layer 410 is formed on the opening 408 and the silicon nitride layer 404.

Figure 4D:
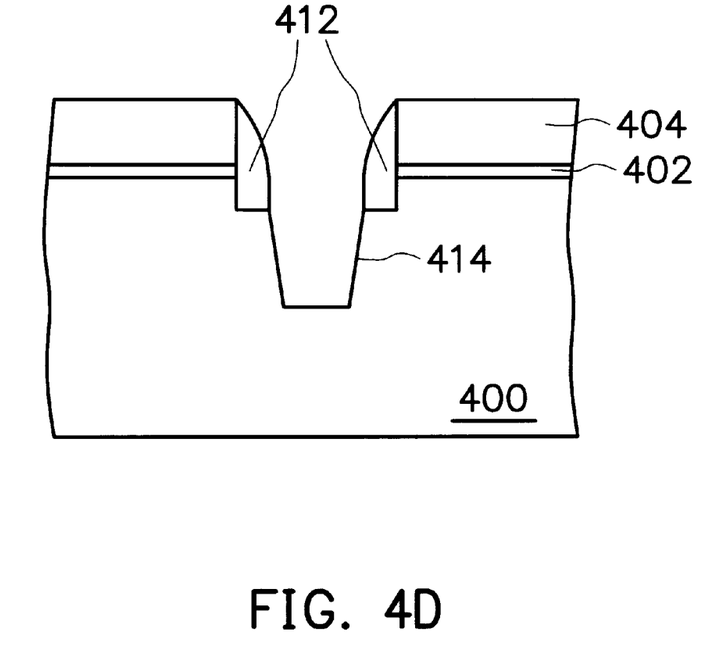

As further illustrated in FIG. 4D, an anisotropic etching is conducted to remove the thin oxide layer 410 (as in FIG. 4C) and to form a spacer 412 on the sidewall of the opening 408 (as in FIG. 4C). Using the spacer 412 and the silicon nitride layer 404 as masks, the substrate 400 is etched to form a shallow trench 414 in the substrate 400.

Figure 4E:
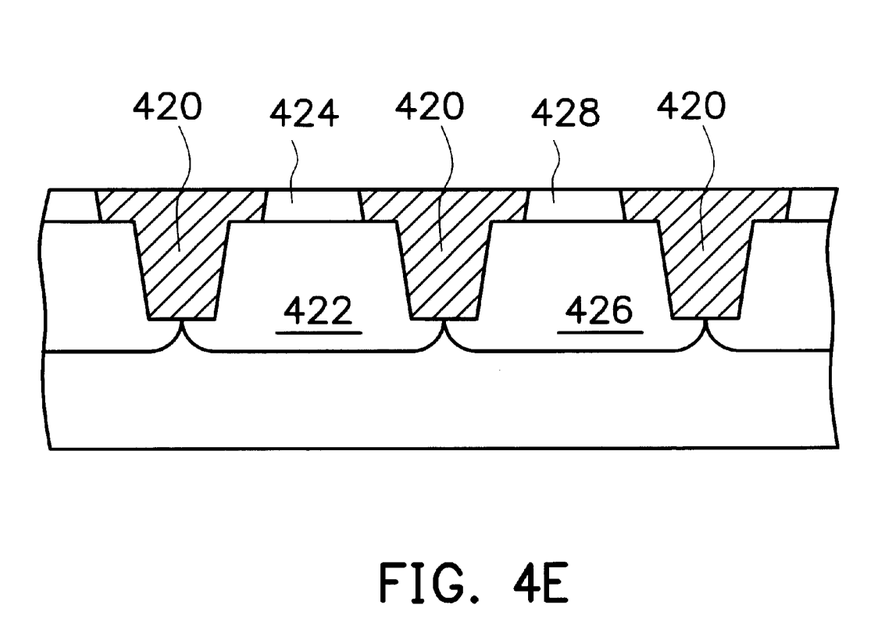

Referring to FIG. 4E, an oxide plug 420 is formed according to the traditional shallow trench fabrication method, filling the opening 408 and the trench 414 (FIG. 4d). Thereafter, an ion implantation is performed on a P-well region 426, an N-well region 422, a P+ type region 424 and an N+ type region 428. The desired concentrations and depths of the implanted ion for these regions can be achieved by using the different masks and the appropriate operating conditions. FIG. 4E further includes the surroundings of the shallow trench isolation structure, which indicate the presence of more than one oxide plug 420.

It is important to note that the depth of the ion implantation can be controlled to within a small range of errors, which is about of 0.05 $\mu$m. The preferred depths for the P+ type region 424 and the N+ type regions 428 are approximately between 500 to 2000 Å.

Furthermore, the ion implantation procedure can be conducted in between any other steps of the process, which is easily achieved by those who are familiar with the technique.

(Third Embodiment)

FIG. 5A to 5E are schematic cross-sectional views of a shallow trench isolation structure showing the manufacturing process of a shallow trench isolation structure according to the current invention.

Figure 5A:
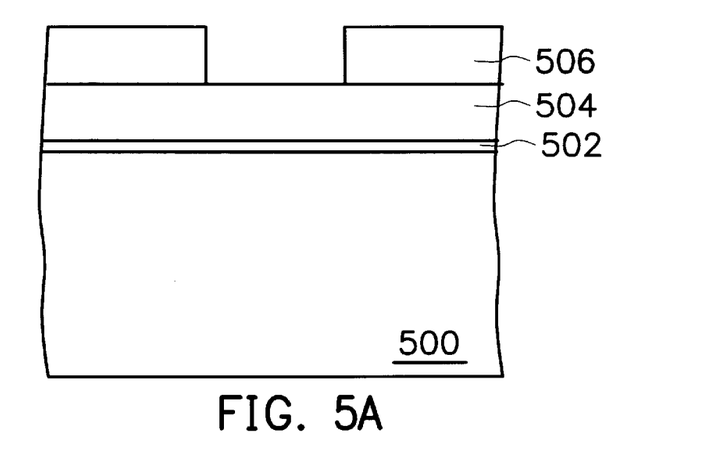
FIGS. 5A to 5E are schematic, cross-sectional views showing the manufacturing steps for a photodiode.

Referring to FIG. 5A, a pad oxide layer 502, a silicon nitride layer 504 and a photo resist pattern 506 are sequentially formed on a substrate 500.

Figure 5B:
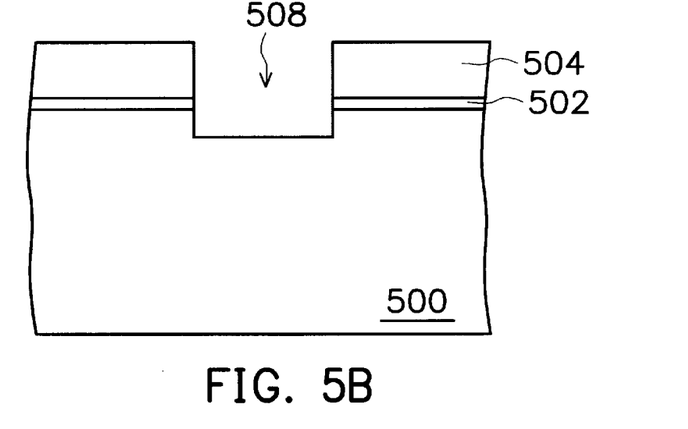

As shown in FIG. 5B, with the photo resist pattern 506 serving as a mask, the substrate 500 is etched to form an opening 508 in the substrate 500.

Figure 5C:
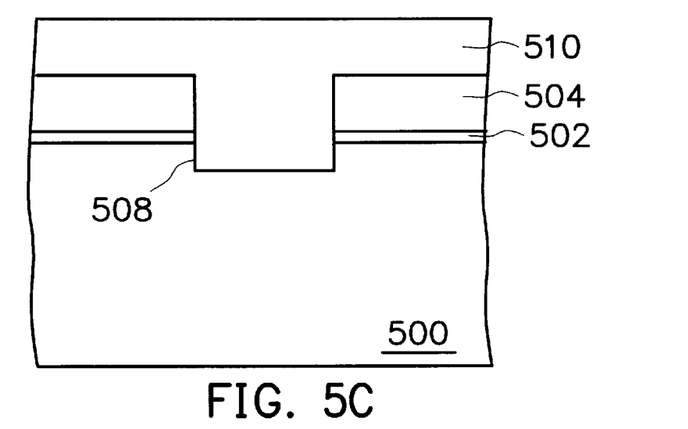

Referring to FIG. 5C, a photo resist layer 510 is formed, filling the opening 508 and covering the silicon nitride layer 504.

Figure 5D:
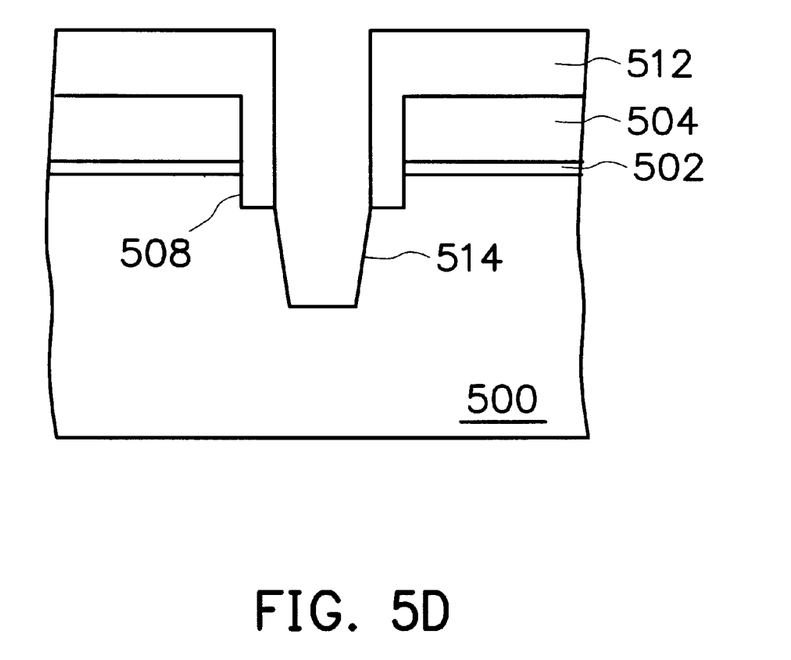

As shown in FIG. 5D, a conventional photolithography technique is used to transform the photo resist layer 510 (as in FIG. 5C) to a photo resist pattern 512. Consequently, the substrate 500 is etched to form a trench 514 in the substrate 500, using the photo resist pattern 512 as a mask. The trench 514, located underneath the opening 508, is narrower than the opening 508.

Figure 5E:
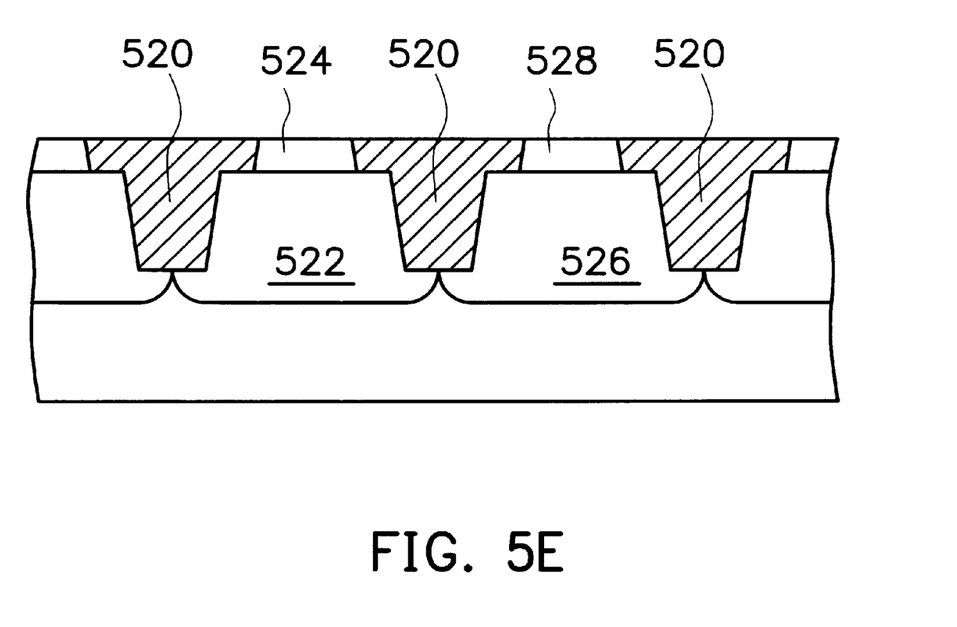

Referring to FIG. 5E, an oxide plug 520 is formed according to the traditional shallow trench fabrication method, filling the opening 508 and the trench 514 (FIG. 5d). Thereafter, an ion implantation is performed on a P-well region 526, an N-well region 522, a P+ type region 524 and an N+ type region 528. The desired concentrations and depths of the implanted ion for these regions can be achieved by using the different masks and the appropriate operating conditions. FIG. 5E further includes the surroundings of the shallow trench isolation structure, which indicates the presence of more than one oxide plug.

It is important to note that the depth of the ion implantation can be controlled to within a small range of errors, which is about 0.05 $\mu$m. The preferred depths for the P+ type region 524 and the N+ type regions 528 are approximately between 500 to 2000 Å.

Furthermore, the ion implantation procedure can be conducted in between any other steps of the process, which can be easily achieved by those who are familiar with the technique.

(Fourth Embodiment)

FIGS. 6A to 6E are schematic cross-sectional views of a photo-diode showing the manufacturing process of a photo-diode according to the current invention, which is also a manufacturing process of a shallow trench isolation structure.

Figure 6A:
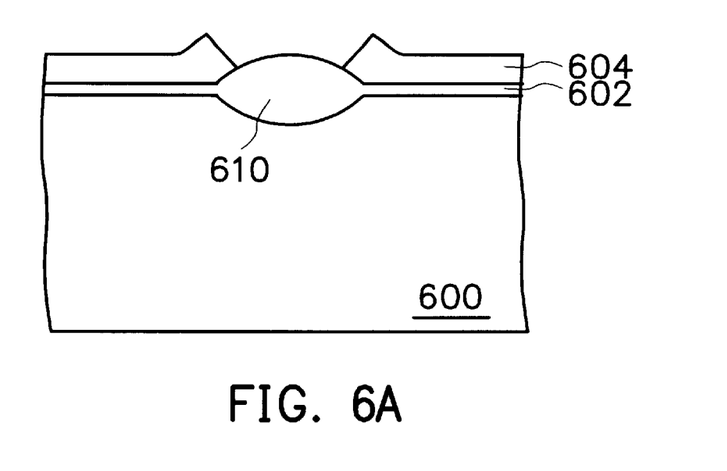
FIGS. 6A to 6E are schematic, cross-sectional views showing the manufacturing steps for a photodiode.

Referring to FIG. 6A, after a pad oxide layer 602 and a patterned silicon nitride mask 604 are sequentially formed on a substrate 600, a field oxide layer 610 is developed by a thermal oxidation treatment.

Figure 6B:
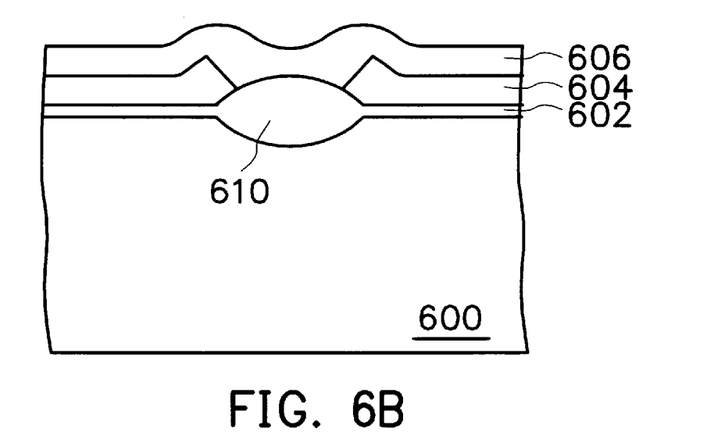

As shown in FIG. 6B, a silicon nitride layer 606 is formed, covering the field oxide layer 610 and the silicon nitride mask pattern 604.

Figure 6C:
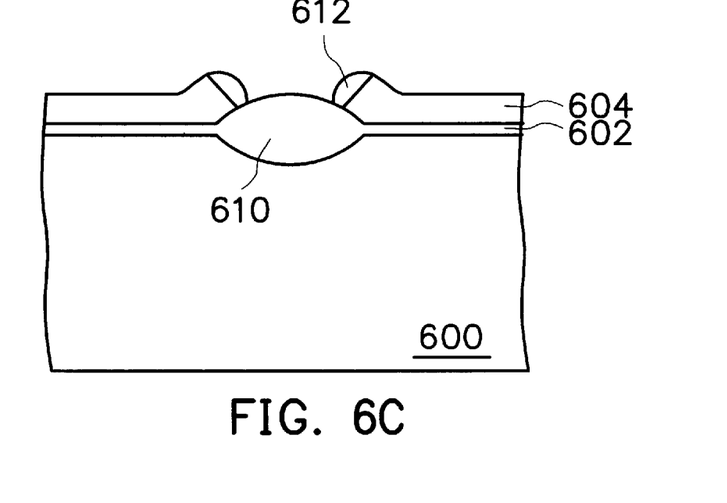

Referring to FIG. 6C, an etching-back is conducted on the silicon nitride layer 606 (as in FIG. 6B) to form a silicon nitride spacer 612 on the sidewall of the opening of the silicon nitride mask pattern 604.

Figure 6D:
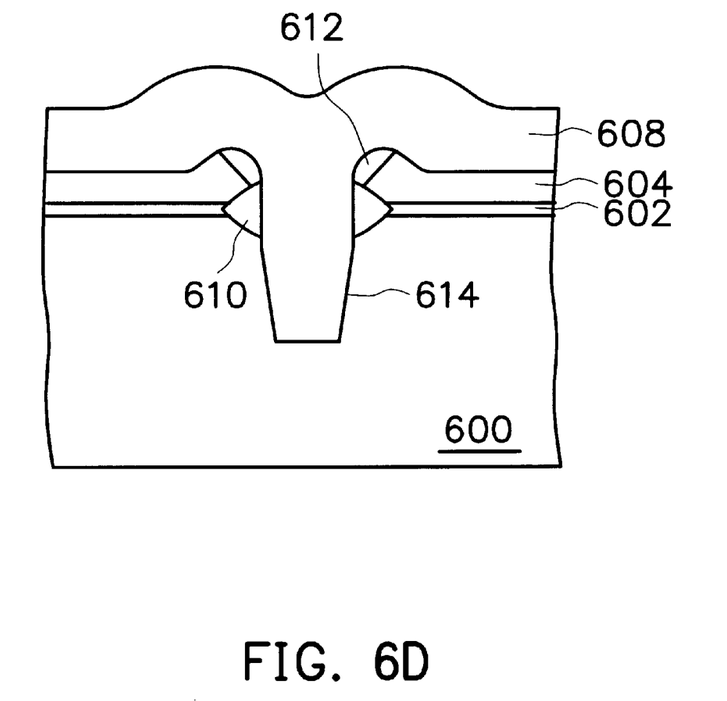

As indicated in FIG. 6D, with the silicon nitride mask pattern 604 and the silicon nitride spacer 612 serving as masks, the field oxide layer 610 and the substrate 600 are etched to form a trench 614 in the substrate 600. After which, an oxide layer 608 is formed, filling the trench 614 and covering the substrate 600 structure.

Figure 6E:
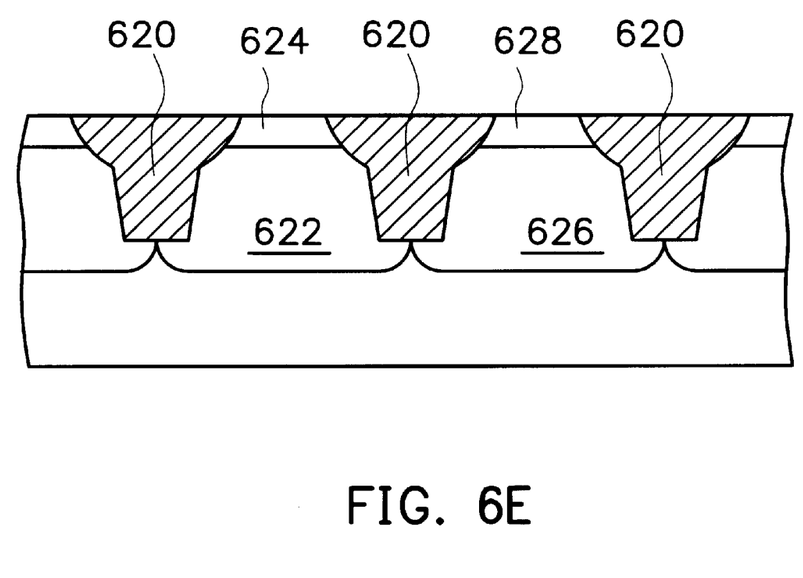

According to FIG. 6E, an oxide plug 620 is formed according to the traditional shallow trench manufacturing method. A complete oxide plug 620 is then formed partially by the oxide layer 608 (as in FIG. 6D) and partially by the field oxide layer 610 (as in FIG. 6D). Thereafter, an ion implantation is conducted on a P-well region 626, an N-well region 622, a P+ type region 624 and an N+ type region 628, whereas the N+ type region 628 and the P+ type region 624 are higher than the trench 614 (in FIG. 6D). The desired concentrations and depths of the implanted ion for these regions can be achieved by using the different masks and the appropriate operating conditions. FIG. 6E further includes the surroundings of the shallow trench isolation structure, which indicate the presence of more than one oxide plug 620.

It is important to note that the depth of ion implantation can be controlled to within a small range of errors, which is about 0.05 $\mu$m. The preferred depths for the P+ type region 624 and the N+ type regions 628 are approximately between 500 to 2000 Å.

Furthermore, the ion implantation procedure can be conducted in between any other steps of the process, which can also be easily achieved by those who are familiar with the technique.

(Fifth Embodiment)

FIGS. 7A to 7E are schematic cross-sectional views of a photo-diode showing the manufacturing process of a photo-diode according to the current invention, which is also a manufacturing process of a shallow trench isolation structure.

Figure 7A:
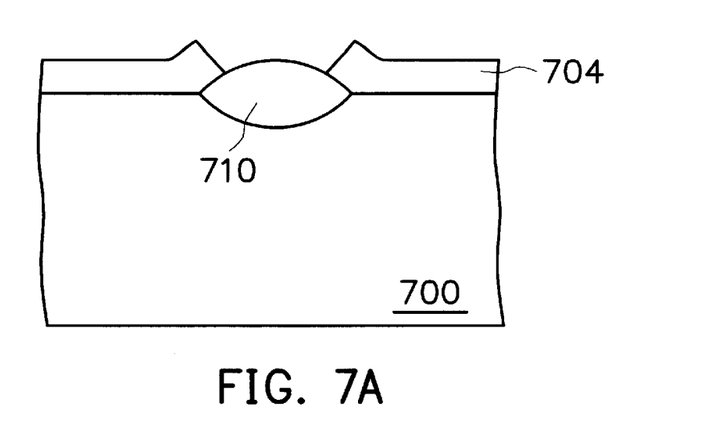
FIGS. 7A to 7E are schematic, cross-sectional views showing the manufacturing steps for a photodiode.

Referring to FIG. 7A, after a silicon nitride mask pattern 704 is formed on the substrate 700, a field oxide layer 710 is formed by thermal oxidation.

Figure 7B:
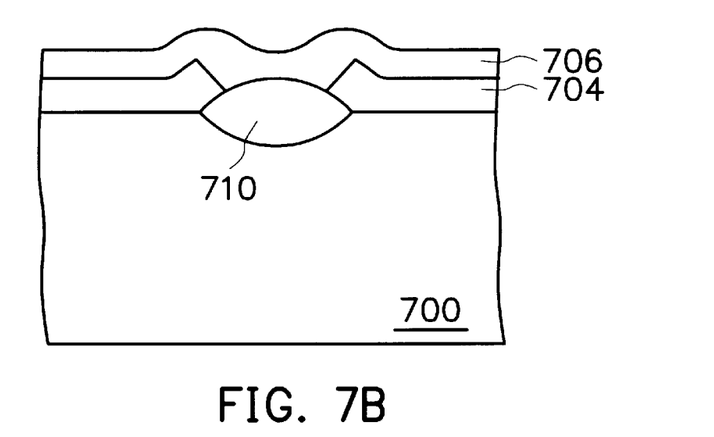

As shown in FIG. 7B, a photo resist layer 706 is formed, covering the field oxide layer 710 and the silicon nitride mask pattern 704.

Figure 7C:
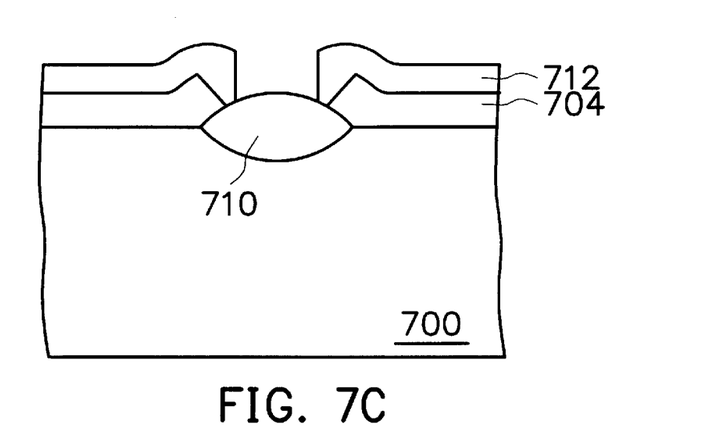

As indicated in FIG. 7C, a photo resist layer 706 is transformed to a photo resist pattern 712 by a conventional photolithography technique.

Figure 7D:
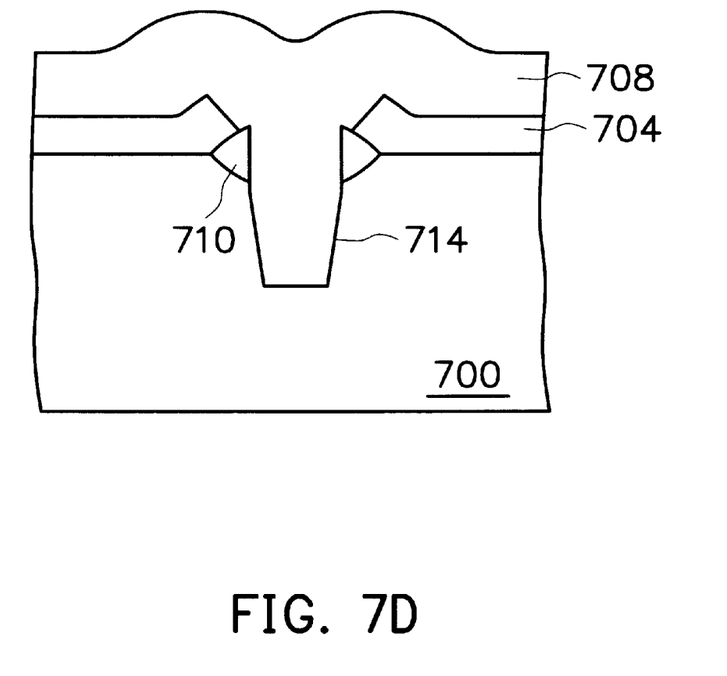

Referring to FIG. 7D, the field oxide layer 710 and the substrate 700 are etched to form a trench 714 in the substrate 700, using the photo resist pattern 712 to serve as a mask. The trench 714, which is located underneath the field oxide layer 710, is narrower than the field oxide layer 710. After which, the photo resist pattern 712 is removed. An oxide layer 708 is then formed, filling the trench and covering the entire structure.

Figure 7E:
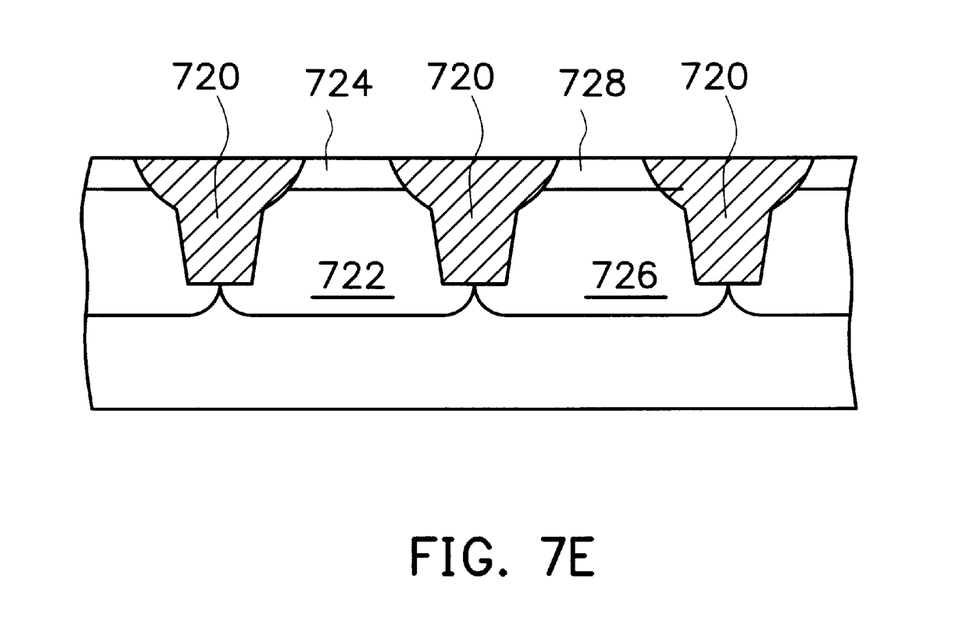

As shown in FIG. 7E, a complete oxide plug 720 is then formed, according to the conventional shallow trench fabrication method, partially by the oxide layer 708 (as in FIG. 7D) and partially by the field oxide layer 710 (as in FIG. 7D). Thereafter, an ion implantation is conducted on a P-well region 726, an N-well region 722, a P+ type region 724 and an N+ type region 728, in which the N+ type region 728 and the P+ type region 724 are higher than the trench 714 (in FIG. 7D). The desired concentrations and depths of the implanted ion for these regions can be achieved by using the different masks and the appropriate operating conditions. FIG. 7E further includes the surroundings of the shallow trench isolation, which indicates the presence of more than one oxide plug 720.

It is important to note that the depth of ion implantation can be controlled to within a small error of 0.05 $\mu$m. The depths for the P+ type region 724 and the N+ type regions 728 are preferably between 500 to 2000 Å.

Furthermore, the ion implantation procedure can be conducted in between any other steps of the process, and can also be easily achieved by those who are familiar with the technique.

In the light of the foregoing, the fabrication method of a photodiode or a shallow trench isolation structure according to this invention provides, at least, the following advantages. With the new photodiode, the breakdown voltage increases and the P-N junction leakage decreases. A decrease in the junction leakage leads to a reduction of a photodiode dark current. The new photodiode also increases the sensitivity of a light sensor device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabrication of a photodiode comprising the steps of:

providing a substrate;

forming sequentially a pad oxide layer and a silicon nitride layer;

patterning sequentially a silicon nitride layer, the pad oxide layer and the substrate to form an opening in the substrate;

forming a spacer on a sidewall of the opening;

forming a trench in the substrate using the spacer and the silicon nitride layer as a mask, wherein a width of the opening is wider than a width of the trench;

forming an oxide plug to fill the trench and the opening;

forming respectively a P-well region and an N-well region on two sides of the trench; and forming respectively an N+ type region and a P+ type region on two sides of the opening; wherein the N+ type region is located on the P-well region and the P+ type region is located on the N-well region, and only the N+ type region and the P+ type region respectively comprises corners at the junction between the N+ type region and P-well region and between the P+ type region and the N-well region so that a junction leakage current is avoided.

2. A method for fabrication of a photodiode comprising the steps of:

providing a substrate;

forming sequentially a pad oxide layer and a silicon nitride layer;

patterning sequentially the silicon nitride, the pad oxide layer and the substrate to form an opening in the substrate;

forming a photoresist pattern in the opening;

etching the substrate to form a trench with the photoresist pattern serving as a mask, wherein a width of the opening is wider than a width of the trench;

forming an oxide plug to fill the trench and the opening;

forming respectively a P-well region and an N-well region on two sides of the trench; and forming respectively an N+ type region and a P+ type region on two sides of the opening; wherein the N+ type region is located on the P-well region and the P+ type region is located on the N-well region, and only the N+ type region and the P+ type region respectively comprise corners at the junction between the N+ type region and the P-well region and between the P+ type region and the N-well region so that a junction leakage current is avoided.

3. A method for fabrication of a photodiode comprising the steps of:

providing a substrate;

forming sequentially a pad oxide layer and a patterned silicon nitride layer;

forming a field oxide layer by thermal oxidation;

etching the field oxide layer and the substrate to form a trench in the substrate with the spacer and the patterned silicon nitride layer serving as a mask;

forming an oxide layer to fill the trench, and to cover the spacer and the patterned silicon nitride layer;

forming an oxide plug;

forming respectively a P-well region and an N-well region on two sides of the trench; and forming respectively an N+ type region and a P+ type region on two sides of the opening; wherein the N+ type region is located on the P-well region and the P+ type region is located on the N-well region, and only the N+ type region and the P+ type region respectively comprise corners at the junction between the N+ type region and the P-well region and between the P+ type region and the N-well region so that a junction leakage current is avoided.

4. A method for fabrication of a photodiode comprising the steps of:

providing a substrate;

forming sequentially a pad oxide layer and a patterned silicon nitride layer;

forming a field oxide layer by thermal oxidation;

forming a photoresist pattern on the field oxide layer and the patterned silicon nitride layer;

etching the field oxide layer and the substrate to form a trench in the substrate using the photoresist as a mask, wherein the trench is located underneath the field oxide layer and is narrower than the field oxide layer;

removing the photoresist pattern;

forming an oxide layer to fill the trench, and to cover the field oxide layer and the patterned silicon nitride layer;

forming an oxide plug;

forming respectively a P-well region and an N-well region on two sides of the oxide plug;

forming respectively an N+ type region and a P+ type region on two sides of the opening; wherein the N+ type region is located on the P-well region and the P+ type region is located on the N-well region, and only the N+ type region and the P+ type region respectively comprise corners at the junction between the N+ type region and the P-well region and between the P+ type region and the N-well region so that a junction leakage current is avoided.

* * * * *